(12) United States Patent
Lee et al.

(10) Patent No.: US 10,247,768 B2
(45) Date of Patent: Apr. 2, 2019

(54) SYSTEM AND METHOD FOR MEASURING INSULATION RESISTANCE OF FUEL CELL VEHICLE

(71) Applicants: Hyundai Motor Company, Seoul (KR); Kia Motors Corporation, Seoul (KR)

(72) Inventors: Kyu Il Lee, Gyeonggi-do (KR); Sung Suk Ok, Gyeonggi-Do (KR); Seon Hak Kim, Gyeonggi-Do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 116 days.

(21) Appl. No.: 15/255,318

(22) Filed: Sep. 2, 2016

(65) Prior Publication Data

US 2017/0356951 A1 Dec. 14, 2017

(30) Foreign Application Priority Data

Jun. 13, 2016 (KR) .................. 10-2016-0073140

(51) Int. Cl.
*G01R 31/12* (2006.01)
*G01R 19/165* (2006.01)
(Continued)

(52) U.S. Cl.
CPC ............ *G01R 31/12* (2013.01); *B60L 3/0046* (2013.01); *B60L 3/0069* (2013.01);
(Continued)

(58) Field of Classification Search
CPC ... G01R 31/12; G01R 19/165; H01M 16/006; H01M 8/04634; H01M 2250/20
See application file for complete search history.

(56) References Cited

U.S. PATENT DOCUMENTS

| 2009/0226769 A1* | 9/2009 | Ota | H01M 8/04029 429/458 |
| 2010/0261084 A1* | 10/2010 | Yoshida | H01M 8/04186 429/432 |

(Continued)

FOREIGN PATENT DOCUMENTS

| JP | 2007-147391 A | 6/2007 |
| JP | 2010-239820 A | 10/2010 |

(Continued)

*Primary Examiner* — Huy Q Phan
*Assistant Examiner* — Zannatul Ferdous
(74) *Attorney, Agent, or Firm* — Mintz Levin Cohn Ferris Glovsky and Popeo, P.C.; Peter F. Corless

(57) ABSTRACT

A system for measuring the insulation resistance of a fuel cell vehicle is provided. The system includes a fuel cell that supplies power, a rechargeable high-voltage battery, and a bidirectional converter, disposed between an output terminal of the fuel cell and the high-voltage battery, to adjust a voltage at the output terminal of the fuel cell. A fast measurement unit measures the insulation resistance of the fuel cell vehicle by being connected to the output terminal of the fuel cell and a second measurement unit measures the insulation resistance of the fuel cell vehicle by being connected to the output terminal of the high-voltage battery. A controller operates the bidirectional converter based on the state of the fuel cell vehicle and measure the insulation resistance of the fuel cell vehicle using the first measurement unit or the second measurement unit.

7 Claims, 2 Drawing Sheets

(51) Int. Cl.
  *H01M 8/04537* (2016.01)
  *H01M 16/00* (2006.01)
  *B60L 3/00* (2019.01)
  *B60L 11/18* (2006.01)

(52) U.S. Cl.
  CPC ........ *B60L 11/1881* (2013.01); *G01R 19/165* (2013.01); *H01M 8/04634* (2013.01); *H01M 8/04649* (2013.01); *H01M 8/04656* (2013.01); *H01M 16/006* (2013.01); *H01M 2250/20* (2013.01); *Y02T 90/32* (2013.01); *Y02T 90/34* (2013.01)

(56) References Cited

U.S. PATENT DOCUMENTS

| | | | |
|---|---|---|---|
| 2012/0141895 A1* | 6/2012 | Kwon | H01M 8/04037 429/429 |
| 2014/0039740 A1* | 2/2014 | Kwon | G06F 17/00 701/22 |
| 2015/0314702 A1* | 11/2015 | Yang | B60L 11/1861 701/22 |
| 2016/0141675 A1* | 5/2016 | Kaneko | H01M 8/0488 429/432 |
| 2016/0351928 A1* | 12/2016 | Hoshi | H01M 8/04902 |

FOREIGN PATENT DOCUMENTS

| | | |
|---|---|---|
| JP | 2010-251103 A | 11/2010 |
| JP | 2013-072751 A | 4/2013 |
| KR | 10-2008-0000657 A | 1/2008 |
| KR | 10-2009-0062334 | 6/2009 |
| KR | 10-2012-0014301 A | 2/2012 |

\* cited by examiner

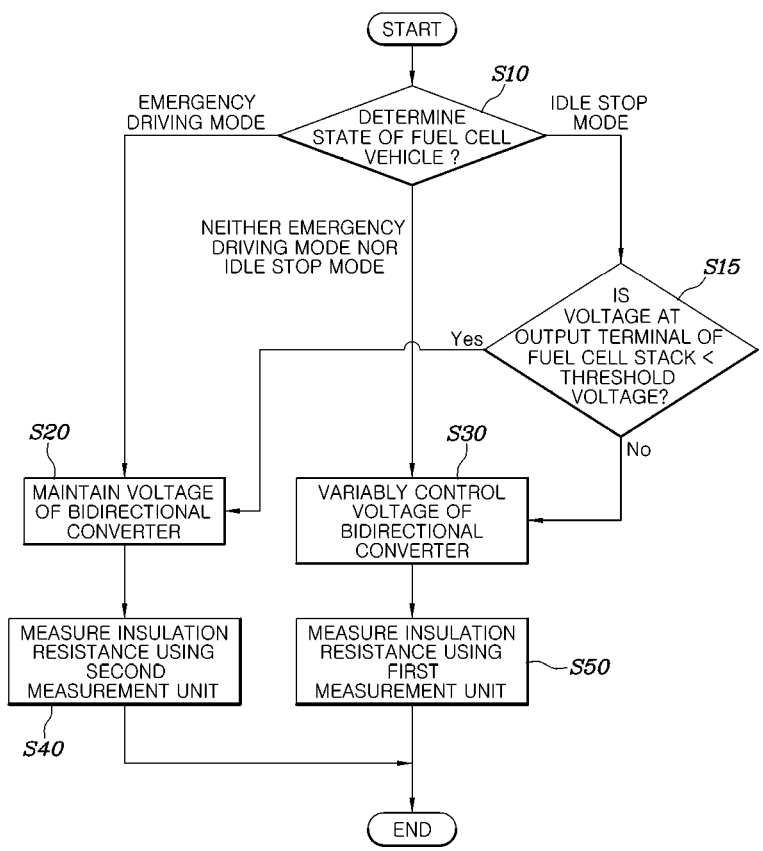

SYSTEM AND METHOD FOR MEASURING INSULATION RESISTANCE OF FUEL CELL VEHICLE

CROSS REFERENCE TO RELATED APPLICATION

The present application claims priority to Korean Patent Application No. 10-2016-0073140, filed Jun. 13, 2016, the entire contents of which is incorporated herein for all purposes by this reference.

BACKGROUND

Field of the Invention

The present invention relates to a system and method for measuring the insulation resistance of a fuel cell vehicle to prevent a driver from receiving an electrical shock, which may occur when the insulation resistance of a high-voltage battery and a fuel cell decreases to less than a certain level in a fuel cell vehicle that includes a high-voltage battery.

Description of the Related Art

A fuel cell system applied to a hydrogen fuel cell vehicle, which is a type of eco-friendly, next-generation vehicle, is configured to include a fuel cell that generates power from an electrochemical reaction of reactant gases, a hydrogen supply system that supplies hydrogen as fuel to the fuel cell, an air supply system that supplies gas, including oxygen as an oxidant necessary for electrochemical reactions, a heat and water management system that manages water and optimally adjusts the operating temperature of the fuel cell by emitting heat, which is a by-product of the electrochemical reactions therein, and a fuel cell system controller that operates the fuel cell system.

In a fuel cell vehicle in which such a fuel cell system is installed, when a fuel cell is used as the power source of the vehicle, all of the loads included in the vehicle depend on the fuel cell, thus degrading performance when the efficiency of the fuel cell is low. Additionally, when a sudden load is applied to the vehicle, since the output voltage of the fuel cell decreases rapidly, sufficient power cannot be supplied to a drive motor, thus decreasing the performance of the vehicle. Furthermore, since the fuel cell has unidirectional output, energy from the drive motor may not be recovered when the vehicle brakes, thus degrading the efficiency of the vehicle system.

Accordingly, a hybrid fuel-cell vehicle has been developed. The hybrid fuel-cell vehicle is a system in which a rechargeable battery, that is, a high-voltage battery capable of being charged and discharged, is installed as an auxiliary power source for supplying power to drive a motor in addition to a fuel cell, which is a main power source, not only in small vehicles but also in large vehicles such as buses and the like. This hybrid fuel-cell vehicle may improve the efficiency of the system. However, since the fuel cell and the high-voltage battery are used at the same time as described above, the insulation resistance may decrease to less than a certain level, entailing the risk of a driver receiving an electrical shock.

The foregoing is intended merely to aid in the understanding of the background of the present invention, and is not intended to mean that the present invention falls within the purview of the related art that is already known to those skilled in the art.

SUMMARY

An object of the present invention is to provide a system and method for measuring the insulation resistance of a fuel cell vehicle, which may measure the insulation resistance of the fuel cell vehicle in all states thereof without the installation of additional devices.

In order to achieve the above object, a system for measuring an insulation resistance of a fuel cell vehicle according to the present invention may include a fuel cell configured to supply power; a rechargeable high-voltage battery; a bidirectional converter disposed between an output terminal of the fuel cell and the high-voltage battery and configured to adjust a voltage at the output terminal of the fuel cell; a first measurement unit configured to measure the insulation resistance of the fuel cell vehicle by being connected to the output terminal of the fuel cell; a second measurement unit configured to measure the insulation resistance of the fuel cell vehicle by being connected to the output terminal of the high-voltage battery; and a controller configured to operate the bidirectional converter based on a state of the fuel cell vehicle and measure the insulation resistance of the fuel cell vehicle using the first measurement unit or the second measurement unit.

When the state of the fuel cell vehicle is an emergency driving mode, the controller may be configured to maintain a voltage of the bidirectional converter at a preset reference voltage and measure the insulation resistance of the fuel cell vehicle using the second measurement unit. The preset reference voltage may be greater than a minimum voltage for operating an electronic unit connected to the output terminal of the fuel cell and be closest to a preset reference voltage for the high-voltage battery.

When the state of the fuel cell vehicle is an idle stop mode and when the voltage at the output terminal of the fuel cell is less than a preset threshold voltage, the controller may be configured to maintain a voltage of the bidirectional converter at a preset reference voltage and measure the insulation resistance of the fuel cell vehicle using the second measurement unit. The threshold voltage may be set using a minimum voltage measurable by the first measurement unit and a minimum voltage for operating an electronic unit connected to the output terminal of the fuel cell.

When the state of the fuel cell vehicle is neither an emergency driving mode nor an idle stop mode, the controller may be configured to variably adjust a voltage of the bidirectional converter based on the state of the fuel cell vehicle and measure the insulation resistance of the fuel cell vehicle using the first measurement unit. When the state of the fuel cell vehicle is an idle stop mode and when the voltage at the output terminal of the fuel cell is equal to or greater than a preset threshold voltage, the controller may be configured to variably adjust a voltage of the bidirectional converter based on the state of the fuel cell vehicle and measure the insulation resistance of the fuel cell vehicle using the first measurement unit, When the insulation resistance measured using the first measurement unit or the second measurement unit is less than a preset reference resistance, the controller may be configured to transmit an alarm signal to an instrument cluster of the fuel cell vehicle. The controller may further be configured to measure the insulation resistance using one measurement unit selected from among the first measurement unit and the second measurement unit.

A method for measuring an insulation resistance of a fuel cell vehicle according to the present invention may include determining, by a controller, a state of the fuel cell vehicle; adjusting, by the controller, a voltage of a bidirectional converter, disposed between an output terminal of a fuel cell and a high-voltage battery, based on the determined state; and measuring, by the controller, the insulation resistance of the fuel cell vehicle using a first measurement unit or a second measurement unit based on the determined state, the first measurement unit configured to measure the insulation resistance by being connected to the output terminal of the fuel cell and the second measurement unit configured to measure the insulation resistance by being connected to the output terminal of the high-voltage battery.

In the adjusting of the voltage of the bidirectional converter, when the state of the fuel cell vehicle is an emergency driving mode, the controller may be configured to maintain the voltage of the bidirectional converter at a preset reference voltage. In the measuring of the insulation resistance, the controller may be configured to measure the insulation resistance of the fuel cell vehicle using the second measurement unit. Additionally, in the adjusting of the voltage of the bidirectional converter, the controller may be configured to variably adjust the voltage of the bidirectional converter based on the state of the fuel cell vehicle when the state of the fuel cell vehicle is neither an emergency driving mode nor an idle stop mode.

Further, in the measuring of the insulation resistance, the controller may be configured to measure the insulation resistance of the fuel cell vehicle using the first measurement unit. In the adjusting of the voltage of the bidirectional converter, when the state of the fuel cell vehicle is an idle stop mode and when a voltage at the output terminal of the fuel cell is less than a preset threshold voltage, the controller may be configured to maintain the voltage of the bidirectional converter at a preset reference voltage.

Furthermore, in the measuring of the insulation resistance, the controller may be configured to measure the insulation resistance of the fuel cell vehicle using the second measurement unit. In the adjusting of the voltage of the bidirectional converter, when the state of the fuel cell vehicle is an idle stop mode and when a voltage at the output terminal of the fuel cell is equal to or greater than a preset threshold voltage, the controller may be configured to variably adjust the voltage of the bidirectional converter based on the state of the fuel cell vehicle. In addition, in the measuring of the insulation resistance, the controller may be configured to measure the insulation resistance of the fuel cell vehicle using the first measurement unit.

BRIEF DESCRIPTION OF THE DRAWINGS

The above and other objects, features and other advantages of the present invention will be more clearly understood from the following detailed description when taken in conjunction with the accompanying drawings, in which:

FIG. 2 is a flowchart of a method for measuring the insulation resistance of a fuel cell vehicle according to an exemplary embodiment of the present invention.

DETAILED DESCRIPTION

Figure 1:
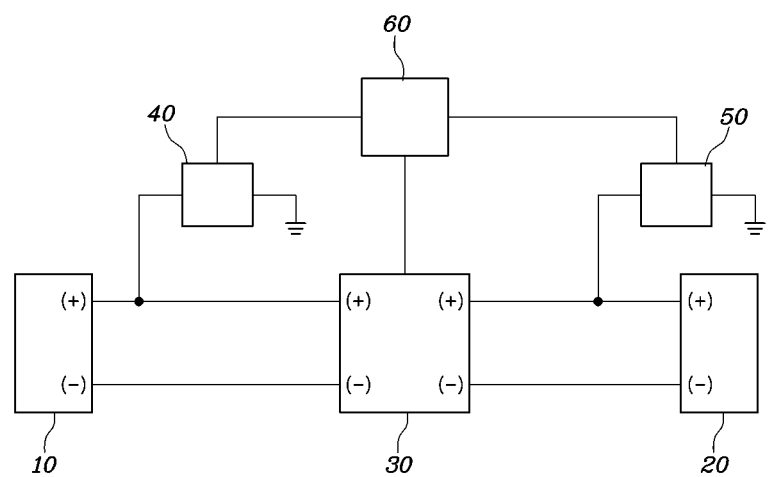
FIG. 1 is a block diagram of a system for measuring the insulation resistance of a fuel cell vehicle according to an exemplary embodiment of the present invention.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

Although exemplary embodiment is described as using a plurality of units to perform the exemplary process, it is understood that the exemplary processes may also be performed by one or plurality of modules. Additionally, it is understood that the term controller refers to a hardware device that includes a memory and a processor. The memory is configured to store the modules and the processor is specifically configured to execute said modules to perform one or more processes which are described further below.

Furthermore, control logic of the present invention may be embodied as non-transitory computer readable media on a computer readable medium containing executable program instructions executed by a processor, controller or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Hereinafter, an exemplary embodiment of the present invention will be described in detail with reference to the accompanying drawings.

A system for measuring the insulation resistance of a fuel cell vehicle according to the present invention may include a fuel cell 10 configured to supply power, a rechargeable high-voltage battery 20; a bidirectional converter 30, disposed between the output terminal of the fuel cell 10 and the high-voltage battery 20, to adjust the voltage at the output terminal of the fuel cell 10; a first measurement unit 40 (e.g., a sensor) configured to measure the insulation resistance of the fuel cell vehicle by being connected to the output terminal of the fuel cell; a second measurement unit 50 (e.g., a sensor) configured to measure the insulation resistance of the fuel cell vehicle by being connected to the output terminal of the high-voltage battery 20; and a controller 60 configured to operate the bidirectional converter 30 based on the state of the fuel cell vehicle and measure the insulation resistance using the first measurement unit 40 or the second measurement unit 50, as illustrated in FIG. 1.

In the present invention, the bidirectional converter 30 may be a device configured to adjust the voltage at the output terminal of the fuel cell 10 to adjust the direction in which current flows between the fuel cell 10 and the high-voltage battery 20. For example, when the bidirectional converter 30 adjusts the voltage at the output terminal of the fuel cell 10 to be less than the voltage at the high-voltage bus terminal between the fuel cell 10 and the bidirectional converter 30, the high-voltage battery may be charged. Conversely, when the bidirectional converter 30 adjusts the voltage at the output terminal of the fuel cell 10 to be greater than the voltage at the high-voltage bus terminal between the fuel cell 10 and the bidirectional converter 30, the high-voltage battery may be discharged. In particular, the voltage at the high-voltage bus terminal of the bidirectional converter 30 may be the voltage that results from the power of a drive motor (not illustrated) of the fuel cell vehicle. Specifically, when the drive motor requires power, the voltage at the high-voltage bus terminal may decrease, and when regenerative braking is performed, the voltage at the high-voltage bus terminal may increase.

Both the first measurement unit 40 and the second measurement unit 50 may be devices configured to measure the insulation resistance of the fuel cell vehicle. In particular, since the first measurement unit 40 may be connected to the output terminal of the fuel cell 10, the first measurement unit 40 may be a fuel cell stack voltage monitor (SVM), which may be configured to monitor the output voltage of the fuel cell 10. Additionally, since the second measurement unit 50 may be connected to the output terminal of the high-voltage battery 20, the second measurement unit 50 may be a battery management system (BMS), which may be configured to monitor the output voltage of the high-voltage battery 20. However, these devices are merely examples, and any device capable of measuring the insulation resistance of a fuel cell vehicle by being connected to the output terminal of the fuel cell 10 or the output terminal of the high-voltage battery 20 may be used.

As described above, the controller 60 according to the present invention may be configured to operate the bidirectional converter 30 based on the state of the fuel cell vehicle and measure the insulation resistance of the fuel cell vehicle using the first measurement unit 40 or the second measurement unit 50. In particular, the state of the fuel cell vehicle may have various meanings, but the present invention categorizes the state of the fuel cell vehicle into an emergency driving mode, an idle stop mode, and a normal mode, which is neither the emergency driving mode nor the idle stop mode, and configures the controller 60 to operate differently based on the state of the fuel cell vehicle to suitably measure the insulation resistance. The idle stop mode may indicate when the vehicle stops or when there is no need to generate power using the fuel cell 10 since a motor may be driven using the power output from the high-voltage battery 20.

Specifically describing the operation of the controller 60 according to each of the cases, when the state of the fuel cell vehicle is the emergency driving mode, the controller 60 may be configured to maintain the voltage of the bidirectional converter 30 at a preset reference voltage and measure the insulation resistance of the fuel cell vehicle using the second measurement unit 50. In particular, the reference voltage may be greater than the minimum voltage for operating an electronic unit connected to the output terminal of the fuel cell 10 and may be closest (e.g., most similar to) to a preset reference voltage for the high-voltage battery 20.

When the state of the fuel cell vehicle is the emergency driving mode, since the power output from the fuel cell 10 may not be used, it is not necessary to variably adjust the voltage at the output terminal of the fuel cell 10. Therefore, the present invention may be configured to maintain the voltage of the bidirectional converter 30, that is, the voltage at the output terminal of the fuel cell 10, at the preset reference voltage. Additionally, since the voltage at the output terminal of the fuel cell becomes 0V regardless of the state of the fuel cell vehicle, the insulation resistance of the fuel cell vehicle may not be measured using the fast measurement unit 40. Therefore, the insulation resistance of the fuel cell vehicle may be measured using the second measurement unit 50, connected to the output terminal of the high-voltage battery 20, which operates normally even in the emergency driving mode.

As described above, the reference voltage is required to be greater than the minimum voltage for operating the electronic unit connected to the output terminal of the fuel cell. Even when the fuel cell 10 is in an abnormal state, the electronic unit, connected to the output terminal of the fuel cell 10, may be operated using the output voltage of the high-voltage battery 20 using the bidirectional converter 30. Therefore, the reference voltage should be greater than the minimum voltage for operating the electronic unit. In addition, the reference voltage may be closest to (e.g., may be about the present reference voltage) the preset reference voltage for the high-voltage battery 20. Particularly, the preset reference voltage for the high-voltage battery 20 may indicate the average voltage of the high-voltage battery 20. Generally, the preset reference voltage may be the normal voltage when the state of charge (SOC) of the high-voltage battery about 20 is 60%. Accordingly, in the present invention, the reference voltage may be set to a voltage that is greater than the minimum voltage for operating the electronic unit and may be closest to the reference voltage for the high-voltage battery 20 to more stably drive the vehicle, and the voltage at the output terminal of the fuel cell may be maintained at the reference voltage using the bidirectional converter 30 in the emergency driving mode. Therefore, even in the emergency driving mode, the electronic unit of the vehicle may be available, but the high-voltage battery 20 may not be overloaded.

Meanwhile, when the state of the fuel cell vehicle is neither the emergency driving mode nor the idle stop mode, that is, when the state is the normal mode, the controller 60 may be configured to variably adjust the voltage of the bidirectional converter 30 based on the state of the fuel cell vehicle and measure the insulation resistance of the fuel cell vehicle using the first measurement unit 40. In particular, since both the fuel cell 10 and the high-voltage battery 20 may operate normally, adjustment for increasing or decreasing the voltage at the output terminal of the fuel cell 10 may be performed based on the output power required by the vehicle, whereby the efficiency of the fuel cell system may be improved. Specifically, when the output power required by the vehicle is high (e.g., greater than a predetermined output power), the voltage at the output terminal of the fuel cell 10 may be increased and when the output power required by the vehicle is low (e.g., less than a predetermined output power), the voltage at the output terminal of the fuel cell 10 may be decreased. Additionally, since the main power source is not the high-voltage battery 20 but the fuel cell 10, the first measurement unit 40 may be used to measure the insulation resistance of the fuel cell vehicle.

Finally, when the state of the fuel cell vehicle is the idle stop mode, the controller 60 may be configured to adjust the voltage of the bidirectional converter 30 based on the magnitude of the voltage at the output terminal of the fuel cell 10 and measure the insulation resistance of the fuel cell vehicle using the first measurement unit 40 or the second measurement unit 50. Specifically, when the state of the fuel cell vehicle is the idle stop mode and when the voltage at the output terminal of the fuel cell 10 is less than a preset threshold voltage, the voltage of the bidirectional converter may be maintained at the preset reference voltage, and the insulation resistance of the fuel cell vehicle may be measured using the second measurement unit 50. Meanwhile, when the state of the fuel cell vehicle is the idle stop mode and when the voltage at the output terminal of the fuel cell 10 is equal to or greater than the preset threshold voltage, the voltage of the bidirectional converter 30 may be variably adjusted based on the state of the fuel cell vehicle, and the insulation resistance of the fuel cell vehicle may be measured using the first measurement unit 40.

Particularly, the voltage of the bidirectional converter 30 may be variably adjusted based on the threshold voltage since when the voltage at the output terminal of the fuel cell 10 is excessively low, the first measurement unit 40 (ex. SVM) may not measure the insulation resistance using the voltage at the output terminal of the fuel cell 10, and the electronic unit connected to the output terminal of the fuel cell may not be operated. Therefore, when the voltage at the output terminal of the fuel cell 10 is equal to or greater than the threshold voltage, the controller 60 may be configured to operate the bidirectional converter 30 and the first measurement unit 40 using the same method used when the fuel cell vehicle is in the normal mode. Conversely, when the voltage at the output terminal of the fuel cell 10 is less than the threshold voltage, the controller 60 may be configured to execute the voltage adjustment using the same method used when the fuel cell vehicle is in the emergency driving mode. Since the threshold voltage may be set to determine whether the first measurement unit 40 may measure the insulation resistance and whether the electronic unit may be operated, the threshold voltage may be set using the minimum voltage measurable by the first measurement unit 40 and the minimum voltage for operating the electronic unit connected to the output terminal of the fuel cell 10. The threshold voltage may be set to the higher voltage of the minimum voltage measurable by the first measurement unit 40 and the minimum voltage for operating the electronic unit. Therefore, according to the present invention, the insulation resistance of the fuel cell vehicle may be measured regardless of the state of the fuel cell vehicle.

Additionally, the controller 60 of the present invention may be configured to measure the insulation resistance and transmit an alarm signal to the instrument cluster of the fuel cell vehicle when the insulation resistance measured using the first measurement unit 40 or the second measurement unit 50 is less than a preset reference resistance. In other words, the driver may be exposed to the risk of an electrical shock when the insulation resistance is less than a certain reference value, and thus, the alarm signal may be transmitted to the instrument cluster for the driver of the vehicle to detect the alarm signal. In particular, the reference resistance may be a reference value for determining the insulation resistance that may cause an electrical shock to the driver, and may be variably set based on the type of vehicle, the regulations associated with high voltage, and the like.

Meanwhile, two measurement units, namely, the first measurement unit 40 and the second measurement unit 50, may be provided to measure the insulation resistance. In particular, the insulation resistance may be measured using the second measurement unit 50 when the insulation resistance cannot be measured using the first measurement unit 40, that is, when a vehicle is in the emergency driving mode or when the voltage at the output terminal of the fuel cell 10 is equal to or less than the threshold voltage. Therefore, there is no need to operate the first measurement unit 40 and the second measurement unit 50 simultaneously. Accordingly, in the present invention, the controller 60 may be configured to measure the insulation resistance using either the first measurement unit 40 or the second measurement unit 50, thus preventing power from being unnecessarily consumed.

In conjunction with the above-mentioned system for measuring the insulation resistance of the fuel cell vehicle, a method for measuring the insulation resistance may be performed according to the flowchart illustrated in FIG. 2. The method may be executed by the controller 60.

First, the controller 60 may be configured to determine the state of the fuel cell vehicle at step S10 and perform variable voltage adjustment based on whether the state of the fuel cell vehicle is the emergency driving mode, the idle stop mode, or the normal mode, as illustrated in FIG. 2. In the emergency driving mode, the controller 60 may be configured to maintain the voltage of the bidirectional converter 30 at the preset reference voltage at step S20 and then measure the insulation resistance of the fuel cell vehicle using the second measurement unit 50 at step S40. When the state of the fuel cell vehicle is neither the emergency driving mode nor the idle stop mode, the controller 60 may be configured to variably adjust the voltage of the bidirectional converter 30 based on the state of the fuel cell vehicle at step S30 and then measure the insulation resistance of the fuel cell vehicle using the first measurement unit 40 at step S50.

Finally, when the state of the fuel cell vehicle is the idle stop mode, the voltage adjustment may be performed differently based on the result of the comparison of the voltage at the output terminal of the fuel cell 10 with the threshold voltage at step S15, as described above. Specifically, when the voltage at the output terminal of the fuel cell 10 is less than the preset threshold voltage, the controller 60 may be configured to maintain the voltage of the bidirectional converter 30 at the preset reference voltage at step S20 and measure the insulation resistance using the second measurement unit 50 at step S40, in the same manner as in the emergency driving mode. Conversely, when the voltage at the output terminal of the fuel cell 10 is equal to or greater than the preset threshold voltage, the controller 60 may be configured to variably adjust the voltage of the bidirectional converter 30 based on the state of the fuel cell vehicle at step S30 and then measure the insulation resistance using the first measurement unit 40 at step S50, in the same manner as in the normal mode.

According to the present invention, to measure the insulation resistance of a system in which two high-voltage sources are used, as in a fuel cell vehicle, an additional device for measuring the insulation resistance may be omitted, and the voltage of a bidirectional converter may be adjusted based on the drive mode of the fuel cell vehicle, whereby the insulation resistance of the fuel cell vehicle may be measured. Therefore, regulations associated with the safe use of high voltage may be met, and a driver may be protected from the risk of electrical shock.

Although an exemplary embodiment of the present invention has been described for illustrative purposes, those skilled in the art will appreciate that various modifications, additions and substitutions are possible, without departing from the scope and spirit of the invention as disclosed in the accompanying claims.

What is claimed is:
1. A system for measuring an insulation resistance of a fuel cell vehicle, comprising:

a fuel cell configured to supply power;

a rechargeable high-voltage battery;

a bidirectional converter disposed between an output terminal of the fuel cell and the high-voltage battery and configured to adjust an output voltage at the output terminal of the fuel cell;

a first measurement unit configured to measure the insulation resistance of the fuel cell vehicle by being connected to the output terminal of the fuel cell, wherein the first measurement unit is a fuel cell stack voltage monitor (SVM) that is configured to monitor the output voltage of the fuel cell;

a second measurement unit configured to measure the insulation resistance of the fuel cell vehicle by being connected to an output terminal of the high-voltage battery, wherein the second measurement unit is a battery management system (BMS) that is configured to monitor an output voltage of the high-voltage battery; and a controller configured to operate the bidirectional converter based on a state of the fuel cell vehicle and measure the insulation resistance of the fuel cell vehicle using the first measurement unit or the second measurement unit, wherein when the state of the fuel cell vehicle is an idle stop mode and when the voltage at the output terminal of the fuel cell is less than a preset threshold voltage, the controller is configured to maintain a voltage of the bidirectional converter at a preset reference voltage and measure the insulation resistance of the fuel cell vehicle using the second measurement unit, and wherein the threshold voltage is set using a minimum voltage measurable by the first measurement unit and a minimum voltage for operating an electronic unit connected to the output terminal of the fuel cell.

2. The system of claim 1, wherein when the state of the fuel cell vehicle is an emergency driving mode, the controller is configured to maintain a voltage of the bidirectional converter at a preset reference voltage and measure the insulation resistance of the fuel cell vehicle using the second measurement unit.

3. The system of claim 2, wherein the preset reference voltage is greater than a minimum voltage for operating an electronic unit connected to the output terminal of the fuel cell and is closest to a preset reference voltage for the high-voltage battery.

4. The system of claim 1, wherein when the state of the fuel cell vehicle is a normal mode, the controller is configured to variably adjust a voltage of the bidirectional converter based on the state of the fuel cell vehicle and measure the insulation resistance of the fuel cell vehicle using the first measurement unit.

5. The system of claim 1, wherein when the state of the fuel cell vehicle is an idle stop mode and when the voltage at the output terminal of the fuel cell is equal to or greater than a preset threshold voltage, the controller is configured to variably adjust a voltage of the bidirectional converter based on the state of the fuel cell vehicle and measure the insulation resistance of the fuel cell vehicle using the first measurement unit.

6. The system of claim 1, wherein when the insulation resistance measured using the first measurement unit or the second measurement unit is less than a preset reference resistance, the controller is configured to transmit an alarm signal to an instrument cluster of the fuel cell vehicle.

7. The system of claim 1, wherein the controller is configured to measure the insulation resistance using one measurement unit selected from among the first measurement unit and the second measurement unit.

* * * * *